(12) United States Patent
Tabata et al.

(10) Patent No.: US 12,376,496 B2
(45) Date of Patent: *Jul. 29, 2025

(54) PIEZOELECTRIC CERAMIC COMPOSITION AND PIEZOELECTRIC ACTUATOR

(71) Applicant: KYOCERA CORPORATION, Kyoto (JP)

(72) Inventors: Shuhei Tabata, Kirishima (JP); Takeshi Hirayama, Kirishima (JP); Gen Shimura, Kirishima (JP)

(73) Assignee: KYOCERA CORPORATION, Kyoto (JP)

( * ) Notice: Subject to any disclaimer, the term of this patent is extended or adjusted under 35 U.S.C. 154(b) by 897 days.

This patent is subject to a terminal disclaimer.

(21) Appl. No.: 17/438,408

(22) PCT Filed: Mar. 2, 2020

(86) PCT No.: PCT/JP2020/008602
§ 371 (c)(1),
(2) Date: Sep. 10, 2021

(87) PCT Pub. No.: WO2020/184243
PCT Pub. Date: Sep. 17, 2020

(65) Prior Publication Data
US 2022/0149266 A1    May 12, 2022

(30) Foreign Application Priority Data
Mar. 13, 2019    (JP) .................. 2019-046105

(51) Int. Cl.
*H10N 30/853*    (2023.01)
*B41J 2/14*    (2006.01)
(Continued)

(52) U.S. Cl.
CPC ...... *H10N 30/8542* (2023.02); *B41J 2/14209* (2013.01); *C01G 33/006* (2013.01);
(Continued)

(58) Field of Classification Search
CPC ............. H10N 30/8542; H10N 30/2047; B41J 2/14209; C01G 33/006; C01P 2002/52;
(Continued)

(56) References Cited

U.S. PATENT DOCUMENTS

2015/0099085 A1    4/2015  Nagareda et al.
2017/0036445 A1*   2/2017  Higashibeppu ...... B41J 2/14201

FOREIGN PATENT DOCUMENTS

JP    2007145650 A    6/2007
WO    2014002285 A1    1/2014

OTHER PUBLICATIONS

Chao et al. "Phase structures, electrical properties and temperature stability of (1-x)[(K0.458Na0.542)0.96Li0.04](Nb0.85Ta0.15)O3-xBiFeO3 ceramics", Journal of Alloys and Compounds, 2012, vol. 518, pp. 1-5 (Year: 2012).*

* cited by examiner

Primary Examiner — Andrew J. Oyer
(74) Attorney, Agent, or Firm — HAUPTMAN HAM, LLP

(57) ABSTRACT

In a piezoelectric ceramic composition including potassium sodium niobate, a transition temperature at which a phase transition between an orthorhombic crystal structure and a tetragonal crystal structure occurs lies in a temperature range of $-20°$ C. or higher and $60°$ C. or lower. In the piezoelectric ceramic composition, $\alpha t/\alpha o$ is 0.72 or more, where $\alpha o$ represents a coefficient of linear expansion determined when a crystal structure is orthorhombic in the temperature range, and $\alpha t$ represents a coefficient of linear expansion deter-
(Continued)

| No. | u Na | v Li | x A | w Ag | y Ta | z Sb | A1 | B1 | B2 | Fe | α | β | γ | δ | d31 pC/N | αt/αo |
|---|---|---|---|---|---|---|---|---|---|---|---|---|---|---|---|---|
| 1 | 0.524 | 0.05 | 1 | 0.04 | 0.1 | 0.06 | Bi | Zn | Sn | – | 0.0025 | 0.00125 | 0.00125 | 0 | 110 | 73% |
| 2 | 0.524 | 0.05 | 1 | 0.04 | 0.1 | 0.06 | Bi | Zn | Sn | Fe | 0.0045 | 0.00125 | 0.00125 | 0.001 | 112 | 83% |
| 3 | 0.524 | 0.05 | 1 | 0.04 | 0.1 | 0.06 | Bi | Zn | Sn | Fe | 0.005 | 0.00125 | 0.00125 | 0.00125 | 115 | 85% |
| 4 | 0.524 | 0.05 | 1 | 0.04 | 0.1 | 0.06 | Bi | Zn | Sn | Fe | 0.0075 | 0.00125 | 0.00125 | 0.0025 | 117 | 88% |
| 5 | 0.524 | 0.05 | 1 | 0.04 | 0.1 | 0.06 | Bi | Zn | Sn | Fe | 0.0125 | 0.00125 | 0.00125 | 0.005 | 102 | 86% |
| 6 | 0.524 | 0.05 | 1 | 0.04 | 0.1 | 0.06 | Bi | Zn | Sn | Fe | 0.0225 | 0.00125 | 0.00125 | 0.01 | 99 | 84% |
| 7 | 0.524 | 0.05 | 1 | 0.04 | 0.1 | 0.06 | Bi | Zn | Sn | Fe | 0.0275 | 0.00125 | 0.00125 | 0.0125 | 88 | 83% |
| 8 | 0.524 | 0.05 | 1 | 0.04 | 0.1 | 0.06 | Bi | Zn | Sn | Fe | 0.032 | 0.00125 | 0.00125 | 0.015 | 78 | 72% |
| 9 | 0.524 | 0.05 | 1 | 0 | 0 | 0 | Bi | – | – | Fe | 0.01 | 0 | 0 | 0.005 | 0 | – |
| 10 | 0.524 | 0.05 | 1 | 0 | 0 | 0 | Bi | – | – | Fe | 0.02 | 0 | 0 | 0.01 | 0 | – |
| 11 | 0.524 | 0.05 | 1 | 0 | 0 | 0.03 | – | – | – | – | 0 | 0 | 0 | 0 | 0 | – |
| 12 | 0.524 | 0.05 | 1 | 0 | 0 | 0.06 | – | – | – | – | 0 | 0 | 0 | 0 | 0 | – |
| 13 | 0.524 | 0.05 | 1 | 0 | 0 | 0.09 | – | – | – | – | 0 | 0 | 0 | 0 | 60 | 65% |
| 14 | 0.524 | 0.02 | 1 | 0 | 0.05 | 0 | – | – | – | – | 0 | 0 | 0 | 0 | 48 | 66% |
| 15 | 0.524 | 0.05 | 1 | 0 | 0.1 | 0 | – | – | – | – | 0 | 0 | 0 | 0 | 67 | 64% | mined when a crystal structure is tetragonal in the temperature range.

12 Claims, 5 Drawing Sheets

(51) Int. Cl.
*C01G 33/00* (2006.01)
*H10N 30/20* (2023.01)

(52) U.S. Cl.
CPC ..... *H10N 30/2047* (2023.02); *C01P 2002/52* (2013.01); *C01P 2002/76* (2013.01); *C01P 2006/40* (2013.01)

(58) Field of Classification Search
CPC .............. C01P 2002/76; C01P 2006/40; C04B 2235/3201; C04B 2235/3203; C04B 2235/3206; C04B 2235/3224; C04B 2235/3227; C04B 2235/3229; C04B 2235/3232; C04B 2235/3239; C04B 2235/3244; C04B 2235/3251; C04B 2235/3258; C04B 2235/3272; C04B 2235/3275; C04B 2235/3279; C04B 2235/3281; C04B 2235/3284; C04B 2235/3287; C04B 2235/3291; C04B 2235/3293; C04B 2235/3294; C04B 2235/3298; C04B 2235/768; C04B 2235/9607; C04B 35/495
See application file for complete search history.

FIG. 1

| No. | u Na | v Li | x A | w Ag | y Ta | z Sb | A1 | B1 | B2 | Fe | α | β | γ | δ | d31 pC/N | αt/αo |
|---|---|---|---|---|---|---|---|---|---|---|---|---|---|---|---|---|
| 1 | 0.524 | 0.05 | 1 | 0.04 | 0.1 | 0.06 | Bi | Zn | Sn | — | 0.0025 | 0.00125 | 0.00125 | 0 | 110 | 73% |
| 2 | 0.524 | 0.05 | 1 | 0.04 | 0.1 | 0.06 | Bi | Zn | Sn | Fe | 0.0045 | 0.00125 | 0.00125 | 0.001 | 112 | 83% |
| 3 | 0.524 | 0.05 | 1 | 0.04 | 0.1 | 0.06 | Bi | Zn | Sn | Fe | 0.005 | 0.00125 | 0.00125 | 0.00125 | 115 | 85% |
| 4 | 0.524 | 0.05 | 1 | 0.04 | 0.1 | 0.06 | Bi | Zn | Sn | Fe | 0.0075 | 0.00125 | 0.00125 | 0.0025 | 117 | 88% |
| 5 | 0.524 | 0.05 | 1 | 0.04 | 0.1 | 0.06 | Bi | Zn | Sn | Fe | 0.0125 | 0.00125 | 0.00125 | 0.005 | 102 | 86% |
| 6 | 0.524 | 0.05 | 1 | 0.04 | 0.1 | 0.06 | Bi | Zn | Sn | Fe | 0.0225 | 0.00125 | 0.00125 | 0.01 | 99 | 84% |
| 7 | 0.524 | 0.05 | 1 | 0.04 | 0.1 | 0.06 | Bi | Zn | Sn | Fe | 0.0275 | 0.00125 | 0.00125 | 0.0125 | 88 | 83% |
| 8 | 0.524 | 0.05 | 1 | 0.04 | 0.1 | 0.06 | Bi | Zn | Sn | Fe | 0.032 | 0.00125 | 0.00125 | 0.015 | 78 | 72% |
| 9 | 0.524 | 0.05 | 1 | 0 | 0 | 0 | Bi | — | — | Fe | 0.01 | 0 | 0 | 0.005 | 0 | — |
| 10 | 0.524 | 0.05 | 1 | 0 | 0 | 0 | Bi | — | — | Fe | 0.02 | 0 | 0 | 0.01 | 0 | — |
| 11 | 0.524 | 0.05 | 1 | 0 | 0 | 0.03 | — | — | — | — | 0 | 0 | 0 | 0 | 0 | — |
| 12 | 0.524 | 0.05 | 1 | 0 | 0 | 0.06 | — | — | — | — | 0 | 0 | 0 | 0 | 0 | — |
| 13 | 0.524 | 0.05 | 1 | 0 | 0 | 0.09 | — | — | — | — | 0 | 0 | 0 | 0 | 60 | 65% |
| 14 | 0.524 | 0.02 | 1 | 0 | 0.05 | 0 | — | — | — | — | 0 | 0 | 0 | 0 | 48 | 66% |
| 15 | 0.524 | 0.05 | 1 | 0 | 0.1 | 0 | — | — | — | — | 0 | 0 | 0 | 0 | 67 | 64% |

FIG. 2

| No. | u Na | v Li | x A | w Ag | y Ta | z Sb | A1 | B1 | B2 | Fe | α | β | γ | δ | d31 pC/N | αt/αo |
|---|---|---|---|---|---|---|---|---|---|---|---|---|---|---|---|---|
| 16 | 0.5 | 0.05 | 1 | 0.04 | 0.1 | 0.06 | Bi | Zn | Sn | Fe | 0.0075 | 0.00125 | 0.00125 | 0.0025 | 81 | 84% |
| 17 | 0.54 | 0.05 | 1 | 0.04 | 0.1 | 0.06 | Bi | Zn | Sn | Fe | 0.0075 | 0.00125 | 0.00125 | 0.0025 | 106 | 85% |
| 18 | 0.524 | 0.02 | 1 | 0.04 | 0.1 | 0.06 | Bi | Zn | Sn | Fe | 0.0075 | 0.00125 | 0.00125 | 0.0025 | 90 | 85% |
| 19 | 0.524 | 0.06 | 1 | 0.04 | 0.1 | 0.06 | Bi | Zn | Sn | Fe | 0.0075 | 0.00125 | 0.00125 | 0.0025 | 100 | 83% |
| 20 | 0.524 | 0.05 | 1 | 0.02 | 0.1 | 0.06 | Bi | Zn | Sn | Fe | 0.0075 | 0.00125 | 0.00125 | 0.0025 | 110 | 86% |
| 21 | 0.524 | 0.05 | 1 | 0.06 | 0.1 | 0.06 | Bi | Zn | Sn | Fe | 0.0075 | 0.00125 | 0.00125 | 0.0025 | 110 | 82% |
| 22 | 0.524 | 0.05 | 1 | 0.04 | 0.02 | 0.06 | Bi | Zn | Sn | Fe | 0.0075 | 0.00125 | 0.00125 | 0.0025 | 80 | 87% |
| 23 | 0.524 | 0.05 | 1 | 0.04 | 0.04 | 0.06 | Bi | Zn | Sn | Fe | 0.0075 | 0.00125 | 0.00125 | 0.0025 | 97 | 85% |
| 24 | 0.524 | 0.05 | 1 | 0.04 | 0.06 | 0.06 | Bi | Zn | Sn | Fe | 0.0075 | 0.00125 | 0.00125 | 0.0025 | 104 | 83% |
| 25 | 0.524 | 0.05 | 1 | 0.04 | 0.08 | 0.06 | Bi | Zn | Sn | Fe | 0.0075 | 0.00125 | 0.00125 | 0.0025 | 110 | 82% |
| 26 | 0.524 | 0.05 | 1 | 0.04 | 0.1 | 0 | Bi | Zn | Sn | Fe | 0.0075 | 0.00125 | 0.00125 | 0.0025 | 80 | 88% |
| 27 | 0.524 | 0.05 | 1 | 0.04 | 0.1 | 0.08 | Bi | Zn | Sn | Fe | 0.0075 | 0.00125 | 0.00125 | 0.0025 | 111 | 84% |
| 28 | 0.524 | 0.05 | 1 | 0.04 | 0.1 | 0.1 | Bi | Zn | Sn | Fe | 0.0075 | 0.00125 | 0.00125 | 0.0025 | 81 | 82% |
| 29 | 0.524 | 0.05 | 0.99 | 0.04 | 0.1 | 0.06 | Bi | Zn | Sn | Fe | 0.0075 | 0.00125 | 0.00125 | 0.0025 | 120 | 85% |
| 30 | 0.524 | 0.05 | 1.02 | 0.04 | 0.1 | 0.06 | Bi | Zn | Sn | Fe | 0.0075 | 0.00125 | 0.00125 | 0.0025 | 108 | 81% |

FIG. 3

| No. | u Na | v Li | x A | w Ag | y Ta | z Sb | A1 | B1 | B2 | Fe | α | β | γ | δ | d31 pC/N | αt/αo |
|---|---|---|---|---|---|---|---|---|---|---|---|---|---|---|---|---|
| 31 | 0.524 | 0.05 | 1 | 0.04 | 0.1 | 0.06 | Bi | Mg | Ti | Fe | 0.0075 | 0.00125 | 0.00125 | 0.0025 | 99 | 87% |
| 32 | 0.524 | 0.05 | 1 | 0.04 | 0.1 | 0.06 | Bi | Zn | Ti | Fe | 0.0075 | 0.00125 | 0.00125 | 0.0025 | 97 | 86% |
| 33 | 0.524 | 0.05 | 1 | 0.04 | 0.1 | 0.06 | Bi | Zn | Zr | Fe | 0.0075 | 0.00125 | 0.00125 | 0.0025 | 105 | 85% |
| 34 | 0.524 | 0.05 | 1 | 0.04 | 0.1 | 0.06 | Bi | Zn | Hf | Fe | 0.0075 | 0.00125 | 0.00125 | 0.0025 | 113 | 86% |
| 35 | 0.524 | 0.05 | 1 | 0.04 | 0.1 | 0.06 | Bi | Zn | Ce | Fe | 0.0075 | 0.00125 | 0.00125 | 0.0025 | 88 | 84% |
| 36 | 0.524 | 0.05 | 1 | 0.04 | 0.1 | 0.06 | Bi | Yb | Hf | Fe | 0.0075 | 0.00125 | 0.00125 | 0.0025 | 84 | 85% |
| 37 | 0.524 | 0.05 | 1 | 0.04 | 0.1 | 0.06 | Bi | Yb | Sn | Fe | 0.0075 | 0.00125 | 0.00125 | 0.0025 | 89 | 84% |
| 38 | 0.524 | 0.05 | 1 | 0.04 | 0.1 | 0.06 | Bi | Fe | Sn | Fe | 0.0075 | 0.00125 | 0.00125 | 0.0025 | 106 | 86% |
| 39 | 0.524 | 0.05 | 1 | 0.04 | 0.1 | 0.06 | Bi | Cu | Sn | Fe | 0.0075 | 0.00125 | 0.00125 | 0.0025 | 112 | 85% |
| 40 | 0.524 | 0.05 | 1 | 0.04 | 0.1 | 0.06 | Bi | Mg | Ti | Fe | 0.0075 | 0.00125 | 0.00125 | 0.0025 | 112 | 84% |
| 41 | 0.524 | 0.05 | 1 | 0.04 | 0.1 | 0.06 | Bi | Fe | Ti | Fe | 0.0075 | 0.00125 | 0.00125 | 0.0025 | 98 | 87% |
| 42 | 0.524 | 0.05 | 1 | 0.04 | 0.1 | 0.06 | Bi | Cu | Ge | Fe | 0.0075 | 0.00125 | 0.00125 | 0.0025 | 110 | 86% |
| 43 | 0.524 | 0.05 | 1 | 0.04 | 0.1 | 0.06 | Bi | Zn | V | Fe | 0.0075 | 0.00125 | 0.00125 | 0.0025 | 112 | 84% |
| 44 | 0.524 | 0.05 | 1 | 0.04 | 0.1 | 0.06 | Bi | Zn | W | Fe | 0.0075 | 0.00167 | 0.00083 | 0.0025 | 89 | 83% |
| 45 | 0.524 | 0.05 | 1 | 0.04 | 0.1 | 0.06 | Bi | Zn | W | Fe | 0.0075 | 0.00187 | 0.00063 | 0.0025 | 83 | 84% |

FIG. 4

| No. | u Na | v Li | x A | w Ag | y Ta | z Sb | A1 | B1 | B2 | Fe | α | β | γ | δ | d31 pC/N | αt/αo |
|---|---|---|---|---|---|---|---|---|---|---|---|---|---|---|---|---|
| 46 | 0.524 | 0.05 | 1 | 0.04 | 0.1 | 0.06 | Bi | Co | Nb | Fe | 0.0075 | 0.00167 | 0.00083 | 0.0025 | 114 | 85% |
| 47 | 0.524 | 0.05 | 1 | 0.04 | 0.1 | 0.06 | Bi | Co | Sb | Fe | 0.0075 | 0.00167 | 0.00083 | 0.0025 | 114 | 85% |
| 48 | 0.524 | 0.05 | 1 | 0.04 | 0.1 | 0.06 | Bi | Co | Ta | Fe | 0.0075 | 0.00167 | 0.00083 | 0.0025 | 113 | 85% |
| 49 | 0.524 | 0.05 | 1 | 0.04 | 0.1 | 0.06 | Bi | Ni | Nb | Fe | 0.0075 | 0.00167 | 0.00083 | 0.0025 | 114 | 86% |
| 50 | 0.524 | 0.05 | 1 | 0.04 | 0.1 | 0.06 | Bi | Ni | Sb | Fe | 0.0075 | 0.00167 | 0.00083 | 0.0025 | 114 | 84% |
| 51 | 0.524 | 0.05 | 1 | 0.04 | 0.1 | 0.06 | Bi | Ni | Ta | Fe | 0.0075 | 0.00167 | 0.00083 | 0.0025 | 117 | 85% |
| 52 | 0.524 | 0.05 | 1 | 0.04 | 0.1 | 0.06 | Bi | Zn | Sb | Fe | 0.0075 | 0.00167 | 0.00083 | 0.0025 | 114 | 83% |
| 53 | 0.524 | 0.05 | 1 | 0.04 | 0.1 | 0.06 | La | Zn | Sn | Fe | 0.0075 | 0.00125 | 0.00125 | 0.0025 | 100 | 82% |
| 54 | 0.524 | 0.05 | 1 | 0.04 | 0.1 | 0.06 | Ce | Zn | Sn | Fe | 0.0075 | 0.00125 | 0.00125 | 0.0025 | 99 | 86% |
| 55 | 0.524 | 0.05 | 1 | 0.04 | 0.1 | 0.06 | Nd | Zn | Sn | Fe | 0.0075 | 0.00125 | 0.00125 | 0.0025 | 98 | 84% |
| 56 | 0.524 | 0.05 | 1 | 0.04 | 0.1 | 0.06 | Sm | Zn | Sn | Fe | 0.0075 | 0.00125 | 0.00125 | 0.0025 | 100 | 84% |

PIEZOELECTRIC CERAMIC COMPOSITION AND PIEZOELECTRIC ACTUATOR

RELATED APPLICATIONS

The present application is a National Phase of International Application No. PCT/JP2020/008602 filed Mar. 2, 2020, which claims priority to Japanese Application No. 2019-046105, filed Mar. 13, 2019.

TECHNICAL FIELD

The present disclosure relates to a piezoelectric ceramic composition and a piezoelectric actuator.

BACKGROUND ART

Piezoelectric ceramic compositions used in, for example, actuators, sensors, vibrators, or filters are known. Various potassium sodium niobate-based piezoelectric ceramic compositions have been proposed as lead-free piezoelectric ceramic compositions (for example, PTL 1 and PTL 2).

CITATION LIST

Patent Literature

PTL 1: Japanese Unexamined Patent Application Publication No. 2007-145650
PTL 2: International Publication No. 2014/002285

SUMMARY OF INVENTION

A piezoelectric ceramic composition according to an aspect of the present disclosure includes potassium sodium niobate. In the piezoelectric ceramic composition, a transition temperature at which a phase transition between an orthorhombic crystal structure and a tetragonal crystal structure occurs lies in a temperature range of −20° C. or higher and 60° C. or lower, and $\alpha t/\alpha o$ is 0.72 or more, where $\alpha o$ represents a coefficient of linear expansion determined when a crystal structure is orthorhombic in the temperature range, and $\alpha t$ represents a coefficient of linear expansion determined when a crystal structure is tetragonal in the temperature range.

BRIEF DESCRIPTION OF DRAWINGS

FIG. 1 is a table showing compositions and properties of samples 1 to 15 according to piezoelectric ceramic compositions.

FIG. 2 is a table showing compositions and properties of samples 16 to 30 according to piezoelectric ceramic compositions.

FIG. 3 is a table showing compositions and properties of samples 31 to 45 according to piezoelectric ceramic compositions.

FIG. 4 is a table showing compositions and properties of samples 46 to 56 according to piezoelectric ceramic compositions.

Figure 5:
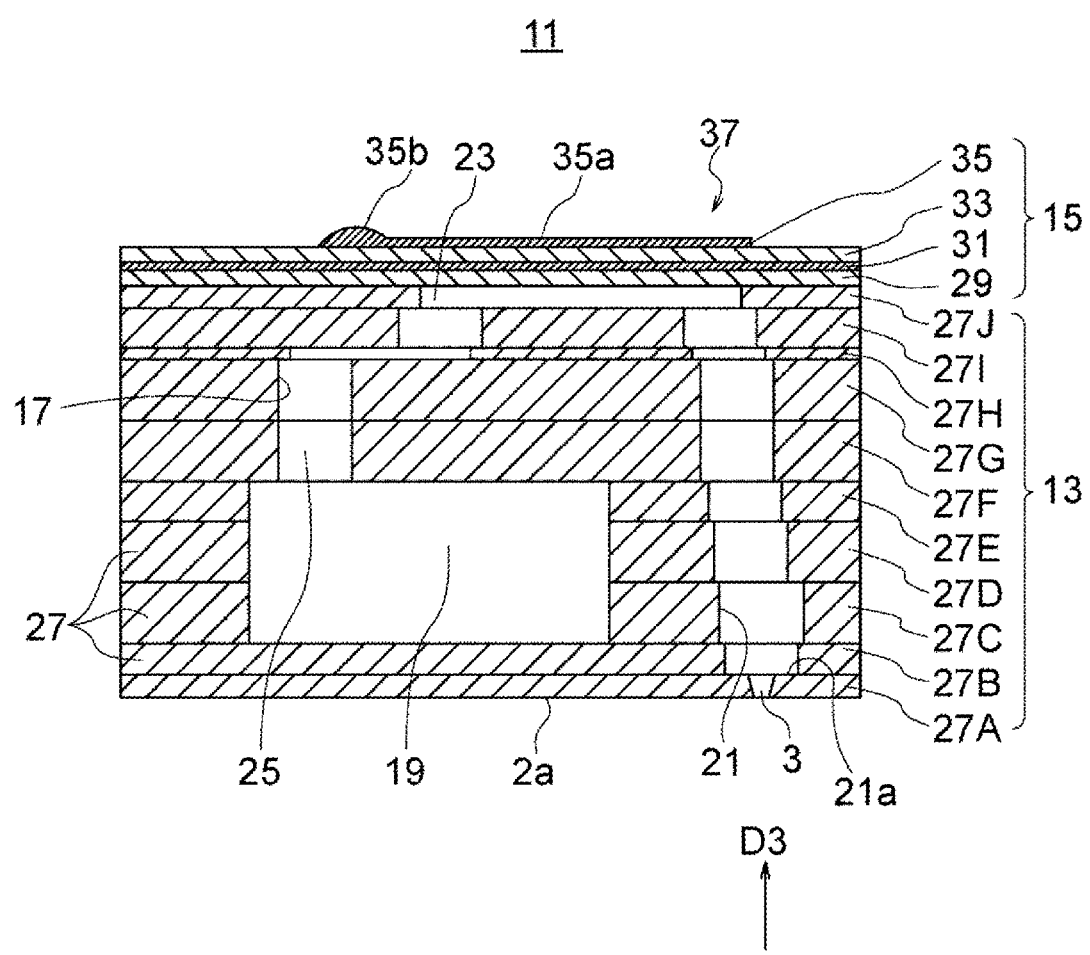
FIG. 5 is a sectional view illustrating an example of a piezoelectric actuator.

DESCRIPTION OF EMBODIMENTS (Composition of Piezoelectric Ceramic Composition)

A piezoelectric ceramic composition according to an embodiment is a potassium sodium niobate-based (KNN-based, alkali niobate-based) piezoelectric ceramic composition and does not contain lead (Pb). The KNN-based piezoelectric ceramic composition is represented by, for example, a simplified composition formula $A_xBO_3$. The A-site mainly contains K (potassium) and Na (sodium), the B-site mainly contains Nb (niobium), and x (molar ratio) is, for example, approximately 1. The piezoelectric ceramic composition has a perovskite structure.

More specifically, the piezoelectric ceramic composition according to an embodiment is represented by the following composition formula.

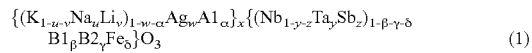

$$\{(K_{1-u-v}Na_uLi_v)_{1-w-\alpha}Ag_wAl_\alpha\}_x\{(Nb_{1-y-z}Ta_ySb_z)_{1-\beta-\gamma-\delta}B1_\beta B2_\gamma Fe_\delta\}O_3 \quad (1)$$

In formula (1) above, A1, B1, and B2 are metal elements. Note that Li represents lithium, Ag represents silver, Ta represents tantalum, Sb represents antimony, and Fe represents iron. In formula (1), u, v, w, y, z, α, β, γ, and δ each represent a molar ratio.

As described above, the molar ratio (x) of the A-site to the B-site is approximately 1 (for example, 0.95 or more and 1.05 or less). The ratio of the amount of K and Na elements that accounts for the amount of the A-site elements is relatively large. For example, the molar ratio ((1−v)×(1−w−α)) of the proportion of K and Na that account for the A-site may be 0.80 or more, 0.85 or more, or 0.90 or more. The ratio of the amount of Nb element that accounts for the amount of the B-site elements is relatively large. For example, the molar ratio ((1−y−z)×(1−β−γ−δ)) of the proportion of Nb that accounts for the B-site may be 0.70 or more, 0.75 or more, or 0.80 or more.

The molar ratio (1−u−v:u) of K to Na is approximately 1:1, provided that the amount of Na element may be larger than the amount of K element. That is, the piezoelectric ceramic composition according to an embodiment may be a Na-rich KNN. For example, u/(1−u−v) may be 1.01 or more, 1.1 or more, or 1.2 or more, and 1.5 or less, 1.4 or less, or 1.3 or less. The lower limit and the upper limit may be appropriately combined.

The piezoelectric ceramic composition contains, in addition to K and Na, which are alkali metals, Li, which is also an alkali metal, at the A-site. Specifically, the piezoelectric ceramic composition according to an embodiment is a potassium sodium lithium niobate-based piezoelectric ceramic composition. The molar ratio of Li to K and Na (in another viewpoint, the ratio of the amount of Li element that accounts for the amount of the A-site elements) is relatively small. For example, the molar ratio (v×(1−w−α)) of the proportion of Li that accounts for the A-site may be 0.1 or less, 0.06 or less, or 0.05 or less. The ratio of the amount of Li, K, and Na elements that accounts for the amount of the A-site elements is relatively large. For example, the molar ratio (1−w−α) of the proportion of Li, K, and Na that account for the A-site may be 0.90 or more, 0.95 or more, or 0.98 or more. When the piezoelectric ceramic composition contains Li, for example, piezoelectric properties are improved.

The piezoelectric ceramic composition contains, in addition to Nb, which belongs to group 5 of the periodic table, Ta, which also belongs to group 5, and Sb, which belongs to group 15 (former group 5B) at the B-site. The molar ratio of Ta and Sb to Nb (in another viewpoint, the ratio of the amount of Ta and Sb elements that accounts for the amount of the B-site elements) is relatively small. For example, the molar ratio $((y+z)\times(1-\beta-\gamma-\delta))$ of the proportion of Ta and Sb that account for the B-site may be 0.25 or less, 0.20 or less, or 0.16 or less. The ratio of the amount of Nb, Ta, and Sb elements that accounts for the amount of the B-site elements is relatively large. For example, the molar ratio $(1-\beta-\gamma-\delta)$ of the proportion of Nb, Ta, and Sb that account for the B-site may be 0.90 or more, 0.97 or more, or 0.99 or more. When the piezoelectric ceramic composition contains Ta and/or Sb, for example, piezoelectric properties are improved.

The piezoelectric ceramic composition contains, in addition to K, Na, and Li, Ag and A1 (any metal element) at the A-site. As is understood from the above description of the molar ratios of K, Na, and Li, the ratio (w and $\alpha$) of the amount of Ag and A1 elements that accounts for the amount of the A-site elements is relatively small. For example, in contrast to the description of the molar ratios of K and other elements, the molar ratio $(w+\alpha)$ of the proportion of Ag and A1 that account for the A-site may be 0.10 or less, 0.05 or less, or 0.02 or less. When the piezoelectric ceramic composition contains Ag and another metal element at the A-site, for example, piezoelectric properties are improved.

The piezoelectric ceramic composition contains, in addition to Nb, Ta, and Sb, B1 (any metal element), B2 (any metal element), and Fe at the B-site. As is understood from the above description of the molar ratio of Nb, Ta, and Sb, the ratio of the amount of B1, B2, and Fe elements that accounts for the amount of the B-site elements is relatively small. For example, in contrast to the description of the molar ratios of Nb and other elements, the molar ratio $(\beta+\gamma+\delta)$ of the proportion of B1, B2, and Fe that account for the B-site may be 0.10 or less, 0.03 or less, or 0.01 or less. When the piezoelectric ceramic composition contains Fe and other metal elements at the B-site, for example, piezoelectric properties are improved. In addition, Fe contributes to an improvement in the insulation resistance.

A1 may be selected from various metals. A1 may be only a single metal element or a combination a plurality of metal elements. In Examples described later, Bi (bismuth), La (lanthanum), Ce (cerium), Nd (neodymium), and Sm (samarium) are used as examples of A1. Among the above elements, Bi is a metal in group 15 (former group 5B). Metal elements in group 5 or group 15 other than Bi may be used as A1. Among the above elements, La, Ce, Nd, and Sm are lanthanoids. Lanthanoids other than the above may be used as A1.

B1 may be selected from various metals. B1 may be only a single metal element or a combination a plurality of metal elements. In Examples described later, Zn (zinc), Mg (magnesium), Yb (ytterbium), Fe (iron), Cu (copper), Co (cobalt), and Ni (nickel) are used as examples of B1. Among the above elements, Zn, Fe, Cu, Co, and Ni are metal elements in period 4 and are transition metals except for Zn. For example, transition metals in period 4 other than the above may be used as B1. Among the above elements, Yb is a lanthanoid. Lanthanoids other than Yb may be used as B1.

B2 may be selected from various metals. B2 may be only a single metal element or a combination a plurality of metal elements. In Examples described later, Sn (tin), Ti (titanium), Zr (zirconium), Hf (hafnium), Ce (cerium), Ge (germanium), V (vanadium), W (tungsten), Nb (niobium), Sb (antimony), and Ta (tantalum) are used as examples of B2. Among the above elements, elements other than Ce are metal elements in period 4 to period 6 and in group 4 to group 6, group 14 (former group 4B), and group 15 (former group 5B). For example, metal elements (excluding Pb) in period 4 to period 6 and in group 4 to group 6, and group 14 to group 16 (former group 4B to former group 6B) other than the above may be used as B2. Among the above elements, Ce is a lanthanoid. Lanthanoids other than Ce may be used as B2.

The molar ratios (u, v, w, x, y, z, $\alpha$, $\beta$, $\gamma$, and $\delta$) may be appropriately determined. An example is as follows: $0.5 \leq u \leq 0.54$, $0 < v \leq 0.06$, $0 < w \leq 0.06$, $0.99 \leq x \leq 1.02$, $0 < y \leq 0.12$, $0 < z \leq 0.1$, $0 < \alpha \leq 0.0275$, $0 < \beta \leq 0.005$, $0 < \gamma \leq 0.005$, and $0 < \delta \leq 0.0125$.

As shown above, v, w, y, z, $\alpha$, $\beta$, $\gamma$, and $\delta$ are larger than 0. When these values are larger than 0, the effect of adding Li, Ag, Ta, Sb, A1, B1, B2, and Fe to potassium sodium niobate ($(K, Na)NbO_3$) is achieved to some degree. The other lower limits and upper limits are based on Examples described later. When the molar ratios are within the above ranges, for example, the effect of improving piezoelectric properties is achieved.

(Method for Producing Piezoelectric Ceramic Composition)

A method for producing a piezoelectric ceramic composition according to the present embodiment may be the same as a known method for producing a potassium sodium niobate-based piezoelectric ceramic composition except for the types of specific metal elements added to potassium sodium niobate and molar ratios of the metal elements. The method is, for example, as follows.

First, powders of compounds (for example, oxides) of metal elements included in formula (1) are prepared. Examples of such compounds include $K_2CO_3$, $Na_2CO_3$, $Li_2CO_3$, $Ag_2O$, $Nb_2O_5$, $Ta_2O_5$, $Sb_2O_3$, $Fe_2O_3$, $Bi_2O_3$, ZnO, SnO, $SnO_2$, $SrCO_3$, $TiO_2$, and $SrTiO_3$.

Next, the powders of the compounds are measured (for example, weighed) so as to have the composition of formula (1). Next, the measured powders are mixed in an alcohol by using a ball mill (subjected to wet mixing). In the ball mill, for example, $ZrO_2$ balls may be used. The alcohol used may be, for example, IPA (isopropyl alcohol). The mixing time may be, for example, 20 hours or more and 25 hours or less.

Next, after the resulting mixture is dried, calcination of the mixture is performed. The calcination may be performed, for example, in air at a temperature of 900° C. or higher and 1,100° C. or lower for about three hours. The calcined product is then pulverized with a ball mill. Next, a binder is mixed with the pulverized product, and the resulting mixture is granulated. The binder used may be, for example, PVA (polyvinyl alcohol).

Next, the powder after granulation is formed to have any shape and dimensions. The pressure during forming may be, for example, about 200 MPa. The formed body is then fired to obtain a piezoelectric ceramic composition. The firing may be performed, for example, in air at a temperature of 1,000° C. or higher and 1,250° C. or lower for about two hours. Subsequently, the piezoelectric ceramic composition is subjected to polarization treatment by applying an appropriate magnitude of voltage in an appropriate direction and may be used in a piezoelectric actuator or the like.

(Phase Transition and Coefficient of Linear Expansion of Piezoelectric Ceramic Composition)

A piezoelectric ceramic composition according to an embodiment is used, for example, in a state where the temperature of the piezoelectric ceramic composition and/or the temperature (environmental temperature) around the piezoelectric ceramic composition is in a predetermined operating temperature range. The operating temperature range is, for example, −20° C. or higher and 60° C. or lower or 20° C. or higher and 40° C. or lower, although it varies depending on a device or the like in which the piezoelectric ceramic composition is used.

In this operating temperature range, the value of a coefficient of linear expansion of the piezoelectric ceramic composition varies depending on the change in temperature. A main factor of this is the occurrence of a phase transition between an orthorhombic (rhombic) crystal structure (hereinafter, may be simply referred to as "orthorhombic structure") and a tetragonal crystal structure (hereinafter, may be simply referred to as "tetragonal structure"). In other words, a main factor of this is that the transition temperature between orthorhombic and tetragonal structures lies in the operating temperature range.

More specifically, the piezoelectric ceramic composition has an orthorhombic crystal structure at a temperature lower than the transition temperature and has a tetragonal crystal structure at a temperature higher than the transition temperature. A coefficient of linear expansion of the tetragonal structure (referred to as $\alpha t$) is smaller than a coefficient of linear expansion of the orthorhombic structure (referred to as $\alpha o$). Accordingly, for example, when the temperature of the piezoelectric ceramic composition having an orthorhombic crystal structure increases and exceeds the transition temperature, the crystal structure is transformed from the orthorhombic structure to the tetragonal structure, and the coefficient of linear expansion decreases. Conversely, when the temperature of the piezoelectric ceramic composition having a tetragonal crystal structure decreases and becomes lower than the transition temperature, the crystal structure is transformed from the tetragonal structure to the orthorhombic structure, and the coefficient of linear expansion increases.

The piezoelectric ceramic composition according to the present embodiment has a relatively small difference between $\alpha t$ and $\alpha o$. For example, $\alpha t/\alpha o$ is 0.72 or more. As a result, the above-described change in the coefficient of linear expansion according to a temperature change is reduced. This stabilizes, for example, the operation of a piezoelectric actuator that uses a piezoelectric ceramic composition according to this embodiment. Note that $\alpha t/\alpha o$ is theoretically less than 1.

EXAMPLES

With regard to piezoelectric ceramic compositions according to embodiments, various samples that differ from each other in molar ratios, A1, B1, and B2 were actually produced, and the effect of the composition on properties was examined. FIGS. 1 to 4 are tables showing the results.

In the figures, the column of "No." indicates a sample number. Herein, the composition and properties of 56 types of samples, which are samples 1 to 56, are shown as examples. The columns of "u Na", "v Li", "x A", "w Ag", "y Ta", "z Sb", "$\alpha$", "$\beta$", "$\gamma$", and "$\delta$" indicate values of u, v, x, w, y, z, $\alpha$, $\beta$, $\gamma$, and $\delta$, respectively, in each sample. The columns of "A1", "B1", and "B2" indicate the types of metal elements of A1, B1, and B2, respectively, in each sample. In the columns of "A1", "B1", and "B2", the symbol "-" indicates that a metal element serving as A1, B1, or B2 was not added and corresponds to $\alpha=0$, $\beta=0$, or $\gamma=0$. The column of "Fe" indicates the presence or absence of Fe in each sample. When $\delta>0$, "Fe" is indicated. When $\delta=0$, "-" is indicated. Note that the number of significant digits after the decimal point of each molar ratio is fundamentally the same for the plurality of samples; however, the indication of 0 on the end side is omitted for the sake of convenience.

The column of "d31 pC/N" indicates the value of the piezoelectric constant $d_{31}$ (pC/N) in each sample. Note that $d_{31}$ represents a piezoelectric property in a direction orthogonal to a polarization direction of a piezoelectric ceramic composition when a voltage is applied in the polarization direction. The larger the value of $d_{31}$, the larger the strain generated in response to the intensity of the electric field applied or the larger electric charges generated in response to the pressure applied. In this column, "0" indicates that polarization could not be performed.

The column of "$\alpha t/\alpha o$" indicates, in percentage, a value calculated by dividing the value of the coefficient $\alpha t$ of linear expansion by the coefficient $\alpha o$ of linear expansion. As described above, $\alpha o$ is a coefficient of linear expansion of a piezoelectric ceramic composition determined when the crystal structure of the piezoelectric ceramic composition is mainly orthorhombic, and $\alpha t$ is a coefficient of linear expansion of a piezoelectric ceramic composition determined when the crystal structure of the piezoelectric ceramic composition is mainly tetragonal. The coefficient $\alpha t$ of linear expansion is smaller than the coefficient $\alpha o$ of linear expansion. Therefore, as the value of $\alpha t/\alpha o$ becomes larger (becomes closer to 100%), the difference between $\alpha t$ and $\alpha o$ decreases, and furthermore, the change in the coefficient of linear expansion due to a temperature change is reduced.

The piezoelectric constant $d_{31}$ was measured by using a piezoelectric ceramic composition after polarization in accordance with a standard (EM-4501A Electrical test methods for piezoelectric ceramic vibrators) specified by JEITA (Japan Electronics and Information Technology Industries Association). More specifically, the piezoelectric constant $d_{31}$ was measured by the resonance-antiresonance method with an impedance analyzer. The temperature of the piezoelectric ceramic composition during measurement is 25±5° C. on the basis of the standard.

In the measurement of the coefficients $\alpha t$ and $\alpha o$ of linear expansion, first, the transition temperature was determined for each sample. The transition temperature was determined by examining the temperature dependence of the resonance frequency in the piezoelectric ceramic composition by using an impedance analyzer. Specifically, when the crystal structure of the piezoelectric ceramic composition changes, the resonance frequency also changes. Thus, when the temperature is plotted on the horizontal axis and the resonance frequency is plotted on the vertical axis, an inflection point appears. The temperature at the inflection point was defined as the transition temperature. It was confirmed that, by the measurement with an X-ray diffractometer, a diffraction pattern attributable to a tetragonal structure was obtained in a temperature range higher than the transition temperature, and that a diffraction pattern attributable to an orthorhombic structure was obtained at a temperature lower than the transition temperature. In the samples produced here, the transition temperature was about 25° C.

Next, a first temperature range (orthorhombic temperature range) and a second temperature range (tetragonal temperature range) were determined on the basis of the transition temperature determined as described above. In the first temperature range, the coefficient $\alpha o$ of linear expansion when the crystal structure is orthorhombic is measured. In the second temperature range, the coefficient $\alpha t$ of linear expansion when the crystal structure is tetragonal is measured. A range of transition temperature±10° C. was excluded from the first temperature range and the second temperature range. For example, when the transition temperature was 20° C., the first temperature range was a range of 10° C. or lower and the second temperature range was a range of 30° C. or higher. The lower limit of the first temperature range was −100° C. The upper limit of the second temperature range was a transition temperature from the tetragonal structure to another crystal structure (about 250° C. in the samples produced here).

Subsequently, the coefficients of linear expansion were measured by thermo-mechanical analysis in the first temperature range and the second temperature range. Specifically, a sample was heated or cooled while a load was applied to the sample with a probe, and a linear displacement of the probe caused by this was measured to determine a dimensional change (strain) for each temperature. The coefficients of linear expansion were each determined on the basis of the value of a slope when the temperature was plotted on the horizontal axis and the strain was plotted on the vertical axis.

Samples 1, 9 to 15, and 26 are samples that do not contain some of the elements represented in formula (1) (that do not satisfy formula (1)), and other samples 2 to 8, 16 to 25, and 27 to 56 satisfy formula (1). Among the former, samples 9 to 15 do not contain two or more elements among the elements represented in formula (1), sample 1 does not contain only Fe, and sample 26 does not contain only Sb. In other words, these samples that do not satisfy formula (1) are potassium sodium niobate-based piezoelectric ceramic compositions having compositions simpler than those of the embodiments.

Samples 1 to 8 and 16 to 56, which satisfy formula (1) or which do not contain only one element among the elements represented in formula (1), each have a larger value of $\alpha t/\alpha o$ than samples 9 to 15, which do not contain two or more elements among the elements represented in formula (1). The $\alpha t/\alpha o$ of the former is 72% or more (the number after the decimal point of the value is rounded to the nearest integer). Irrespective of formula (1), a potassium sodium niobate-based piezoelectric ceramic composition having an $\alpha t/\alpha o$ of 72% or more may be considered as a piezoelectric ceramic composition according to an embodiment.

Samples having a value of $\alpha t/\alpha o$ larger than the above may be considered as piezoelectric ceramic compositions according to the present embodiment. For example, piezoelectric ceramic compositions having an $\alpha t/\alpha o$ of more than 72% (the number after the decimal point of the value is rounded to the nearest integer) may be extracted. In this case, sample 8 is excluded from the samples having an $\alpha t/\alpha o$ of 72% or more. Samples 8 is a sample having larger molar ratios $\alpha$ and $\delta$ than the other samples.

Alternatively, for example, piezoelectric ceramic compositions having an $\alpha t/\alpha o$ of 85% or more (the number after the decimal point of the value is rounded to the nearest integer) may be considered as piezoelectric ceramic compositions according to the present embodiment. Such piezoelectric ceramic compositions are samples 3 to 5, 17, 18, 20, 22, 23, 26, 29, 31 to 34, 36, 38, 39, 41, 42, 46 to 49, 51, and 54.

In 2 to 8, 16 to 25, and 27 to 56, a value higher than that in samples 1, 9 to 15, and 26, which do not satisfy formula (1), is exhibited in at least one of the piezoelectric constant $d_{31}$ and the ratio $\alpha t/\alpha o$ of the coefficients of linear expansion. Among the samples that do not satisfy (1), samples 9 to 15 have a piezoelectric constant $d_{31}$ of less than 70 (pC/N), and furthermore, in samples 9 to 12, polarization cannot be performed. In contrast, in each of the samples that satisfy formula (1), a value of 70 (pC/N) or more can be ensued as the piezoelectric constant $d_{31}$.

From the above results, it was confirmed that when the composition of a piezoelectric ceramic composition satisfied formula (1), piezoelectric properties were improved. In addition, an example of the range of a molar ratio can be derived from the minimum and the maximum of the molar ratio of the samples that satisfy formula (1). For example, $0.5 \le u \le 0.54$ is derived from samples 16 and 17; $0.02 \le v \le 0.06$ is derived from samples 18 and 19; $0.02 \le w \le 0.06$ is derived from samples 20 and 21; $0.99 \le x \le 1.02$ is derived from samples 29 and 30; $0.02 \le y \le 0.1$ is derived from sample 22 and multiple samples; $0.06 \le z \le 0.1$ is derived from sample 28 and multiple samples; $0.0045 \le \alpha \le 0.0275$ is derived from samples 2 and 7; $0.00125 \le \beta \le 0.00187$ is derived from multiple samples and sample 45; $0.00063 \le \gamma \le 0.00125$ is derived from sample 45 and multiple samples; and $0.001 \le \delta \le 0.0125$ is derived from samples 2 and 7.

Samples 4 and 51 have the highest value of the piezoelectric constant $d_{31}$ ($d_{31}$=117 pC/N). Samples 4 and 26 have the highest value of $\alpha t/\alpha o$ ($\alpha t/\alpha o$=88%). Accordingly, sample 4 has both the highest value of the piezoelectric constant $d_{31}$ and the highest value of $\alpha t/\alpha o$. FIGS. 1 to 4 show the compositions and properties of samples in which various molar ratios and the types of metal elements are changed by mainly focusing on (with respect to) this sample 4.

Sample 4 is one of samples having the highest properties in view of the piezoelectric constant $d_{31}$ and $\alpha t/\alpha o$. Therefore, the lower limits or upper limits of various molar ratios may be derived (the lower limits or upper limits that have been described above may be modified) by adding or subtracting a predetermined error or an acceptable value of deviation with respect to the values of the molar ratios of sample 4.

For example, in $0.02 \le y \le 0.1$ described above, the upper limit is based on the value of y in sample 4. However, from the properties of samples 22 to 25 (y=0.02 to 0.08) that differ from sample 4 only in value of y, it is obvious that properties equal to or higher than those of samples 4 and 22 to 25 are obtained even if y slightly exceeds 0.1. Accordingly, the upper limit of y may be 0.12 ($y \le 0.12$ may be satisfied).

The values of $\beta$ and $\gamma$ are each 0.00125 in sample 4. Furthermore, in other samples that satisfy formula (1), relatively narrow ranges including 0.00125 ($0.00167 \le \beta \le 0.0125$, and $0.00063 \le \gamma \le 0.00125$) are shown. Meanwhile, B1 related to $\beta$ and B2 related to $\gamma$ cause discontinuity in the perovskite structure at the B-site as well as Fe related to $\delta$. Accordingly, the ranges of the values of $\beta$ and $\gamma$ may be set with reference to the value of $\delta$. Herein, $\delta$ may be a value (sample 2) less than a half of 0.0025 in sample 4 and may be a value (sample 7) five times 0.0025 in sample 4. Accordingly, $\beta$ and $\gamma$ may be set to be included in a range of a half of 0.00125 or more and five times 0.00125 or less as well as $\delta$, or in a range narrower than this. For example, $0.001 \le 62 \le 0.005$ and $0.001 \le \gamma \le 0.005$ may be satisfied.

Among the samples having an $\alpha t/\alpha o$ of 72% or more, samples 1 to 8 and 16 to 52 contain Bi as A1 as well as sample 4. Of these, samples 2 to 7 and 16 to 52 have a larger $\alpha t/\alpha o$ than samples 1 and 8. Here, sample 1 does not contain Fe. The value of $\alpha/\delta$ of sample 8 is smaller than each of the values of $\alpha/\delta$ of samples 2 to 7 and 16 to 52 and is about 2.1. Even considering the molar ratio (x) of the A-site, the value of Bi/Fe (molar ratio) of sample 8 is smaller than each of the values of Bi/Fe of samples 2 to 7 and 16 to 52 and is about 2.1. In samples 2 to 7 and 16 to 52, the maximum of $\alpha/\delta$ and/or Bi/Fe is 4.5 of sample 2.

From the above, for example, piezoelectric ceramic compositions in which A1 is Bi and $\alpha/\delta$ and/or Bi/Fe is 2.2 or more and 5.0 or less may be used. Such piezoelectric ceramic compositions are samples 2 to 7 and 16 to 52. Piezoelectric ceramic compositions in which $\alpha/\delta$ and/or Bi/Fe is 2.5 or more and 4.0 or less, or 2.5 or more and 3.25 or less may be used. Such piezoelectric ceramic compositions are samples 2 to 5 and 16 to 52.

Samples 4 and 16 to 19 are samples that differ from each other in values of u and v. Of these, samples 4 and 17 each have a value of the piezoelectric constant $d_{31}$ larger than the values of the piezoelectric constant $d_{31}$ of samples 16, 18, and 19. Herein, the values of u/v of these samples are as follows: sample 4: 10.48, sample 16: 10, sample 17: 10.8, sample 18: 26.2, and sample 19: about 8.7.

From the above, the range of u/v may be determined to, for example, a range that includes the values of u/v of samples 4 and 17 and that does not include the values of u/v of samples 16, 18, and 19. Such a range of the value of u/v may be, for example, 10.1 or more and 26.0 or less, 10.1 or more and 11.0 or less, or 10.48 or more and 10.80 or less.

Samples 4 and 22 to 28 are samples that differ from each other in values of y and z. Of these, samples 4, 24, 25, and 27 each have a value of the piezoelectric constant $d_{31}$ larger than the values of the piezoelectric constant $d_{31}$ of the other samples 22, 23, 26, and 28.

From the above, the ranges of the values of y and z may be set to, for example, ranges that include the values of y and z of the former samples and that do not include the values of y and z of the latter samples. Specifically, the values of z of samples 4, 24, 25, and 27 are in the range of 0.01 or more and 0.09 or less, 0.05 or more and 0.09 or less, or 0.06 or more and 0.08 or less. The values of y/z of samples 4, 24, 25, and 27 are in the range of 0.7 or more and 10 or less, 0.9 or more and 1.8 or less, or 1.0 or more and 1.67 or less. Samples 22, 23, 26, and 28 do not satisfy at least one of the range of z and the range of y/z.

Samples 4 and 31 to 52 are samples that differ from each other in metal elements used as B1 and B2. Of these, samples 4, 33, 34, 38 to 40, 42, 43, and 46 to 52 each have a value of the piezoelectric constant $d_{31}$ larger than the values of the piezoelectric constant $d_{31}$ of the other samples 31, 32, 35 to 37, 41, 44, and 45.

From the above, metal elements of the former samples may be selected as B1 and B2. Specifically, B1 may be any one of Zn, Mg, Fe, Cu, Co, and Ni. In addition or alternatively, B2 may be any one of Sn, Ti, Zr, Hf, Ge, Nb, Sb, and Ta.

Samples 4 and 22 to 25 are samples that differ from each other only in value of y related to Ta. As is understood from these samples, an increase in the value of y enables an increase in the value of the piezoelectric constant $d_{31}$. More specifically, when y is changed from 0.02 (sample 22) to 0.04 (sample 23), the value of the piezoelectric constant $d_{31}$ becomes 90 pC/N or more. Accordingly, the piezoelectric ceramic composition may have a composition that satisfies, for example, $0.04 \leq y \leq 0.1$ (or 0.12).

As described above, in the potassium sodium niobate-based piezoelectric ceramic composition according to the present embodiment, a transition temperature at which a phase transition between an orthorhombic crystal structure and a tetragonal crystal structure occurs lies in a temperature range of $-20°$ C. or higher and $60°$ C. or lower. In piezoelectric ceramic composition, $\alpha t/\alpha o$ is 0.72 or more (the value is rounded to two decimal places) where $\alpha o$ represents a coefficient of linear expansion determined when the crystal structure is orthorhombic in this temperature range, $\alpha t$ represents a coefficient of linear expansion determined when the crystal structure is tetragonal in this temperature range.

Accordingly, for example, a change in the coefficient of linear expansion according to a change in the temperature of the piezoelectric ceramic composition is reduced. As a result, for example, the prediction of thermal stress generated in the piezoelectric ceramic composition is facilitated. Furthermore, for example, a small $\alpha t/\alpha o$ means that the coefficient of linear expansion decreases during a temperature rising process. Accordingly, for example, when a piezoelectric ceramic composition and a material having a larger coefficient of linear expansion than the piezoelectric ceramic composition are fixed to each other, the difference in coefficient of linear expansion increases when the temperature increases. Consequently, thermal stress applied to the piezoelectric ceramic composition rapidly increases. Furthermore, a device that uses the piezoelectric ceramic composition is highly likely to perform an unintended operation. However, according to the piezoelectric ceramic composition according to the present embodiment, such an increase in the difference in coefficient of linear expansion is reduced. Furthermore, thermal stress applied to the piezoelectric ceramic composition is reduced to stabilize the operation of a device.

In the present embodiment, $\alpha t/\alpha o$ may be more than 0.85. In this case, the above effect is further improved.

In the present embodiment, the piezoelectric ceramic composition is represented by a composition formula $A_xBO_3$. The piezoelectric ceramic composition may contain K, Na, and Li that account for 90% or more of an amount of A-site elements, Nb, Ta, and Sb that account for 90% or more of an amount of B-site elements, Ag contained at the A-site, and Fe contained at the B-site.

In this case, for example, as is understood from the comparison between samples 2 to 8, 16 to 25, and 27 to 56 that have the above composition and other samples that do not have the above composition, it is easy to ensure a certain degree of magnitude as a value of the piezoelectric constant $d_{31}$ while $\alpha t/\alpha o$ is 0.72 or more.

In the present embodiment, the piezoelectric ceramic composition may be represented by formula (1) described above. A1 may be Bi, La, Ce, Nd, or Sm or a combination thereof. B1 may be Zn, Mg, Yb, Fe, Cu, Co, or Ni or a combination thereof. B2 may be Sn, Ti, Zr, Hf, Ce, Ge, V, W, Nb, Sb, or Ta or a combination thereof.

In such a composition, for example, as shown in FIGS. 1 to 4, it is easy to ensure a certain degree of magnitude as a value of the piezoelectric constant $d_{31}$ while $\alpha t/\alpha o$ is 0.72 or more. Furthermore, for example, when the piezoelectric ceramic composition is a potassium sodium lithium niobate-based composition among potassium sodium niobate-based compositions, piezoelectric properties are improved. In addition, for example, piezoelectric properties can be improved by Ta, and the insulation resistance can be increased by Fe.

In the present embodiment, the following inequalities may be satisfied: $0.500 \leq u \leq 0.540$, $0.00 < v \leq 0.06$, $0.00 < w \leq 0.06$, $0.99 \leq x \leq 1.02$, $0.00 < y \leq 0.12$, $0.00 < z \leq 0.10$, $0.0000 < \alpha \leq 0.0275$, $0.000 < \beta \leq 0.005$, $0.000 < \gamma \leq 0.005$, and $0.0000 < \delta \leq 0.0125$.

When the molar ratios satisfy the above ranges, for example, as described with reference to FIGS. 1 to 4, it is easy to ensure the value of the piezoelectric constant $d_{31}$ to a certain degree of magnitude while $\alpha t/\alpha o$ is 0.72 or more.

In the present embodiment, A1 may be Bi, and $\alpha/\delta$ may be 2.2 or more and 5.0 or less. In this case, for example, an $\alpha t/\alpha o$ of 0.72 or more is easily achieved.

In the present embodiment, u/v may be 10.1 or more and 11.0 or less. In this case, for example, the value of the piezoelectric constant $d_{31}$ is easily increased.

In the present embodiment, z may be 0.01 or more and 0.09 or less, and y/z may be 0.7 or more and 10.0 or less. In this case, for example, the value of the piezoelectric constant $d_{31}$ is easily increased.

In the present embodiment, B1 may be any one of Zn, Mg, Fe, Cu, Co, and Ni. B2 may be any one of Sn, Ti, Zr, Hf, Ge, Nb, Sb, and Ta. In this case, for example, the value of the piezoelectric constant $d_{31}$ is easily increased.

In particular, when A1 is Bi (bismuth), B1 is Zn (zinc), and B2 is Sn (tin), the following formulae may be satisfied: $0.524 \leq u \leq 0.540$, $0.05 \leq v \leq 0.06$, $0.02 \leq w \leq 0.06$, $0.99 \leq x \leq 1.02$, $0.04 \leq y \leq 0.10$, $0.06 \leq z \leq 0.08$, $0.0045 \leq \alpha \leq 0.0125$, $0.000 < \beta \leq 0.005$, $\beta = \gamma$, and $0.0010 \leq \delta \leq 0.0100$. When the above formulae are satisfied, a piezoelectric constant $d_{31}$ of 95 (pC/N) or more and a value of αt/αo of 0.81 or more are ensured. Consequently, piezoelectric properties are improved and thermal stress applied to the piezoelectric ceramic composition is reduced, and thus the operation of a device can be stabilized.

A1 may be La (lanthanum), Ce (cerium), Nd (neodymium), or Sm (samarium) instead of Bi (bismuth). The above effect is also obtained in this case. When B2 is Sn (tin) and B1 is Fe (iron), Cu (copper), or Mg (magnesium) instead of Zn (zinc), the above effect is also obtained. When B1 is Zn (zinc) and B2 is Ti (titanium), Zr (zirconium), Hf (hafnium), or Ge (germanium) instead of Sn (tin), the above effect is also obtained. In a case of a combination in which B2 is Ti (titanium) and B1 is Mg (magnesium), Fe (iron), or Cu (copper), the above effect is also obtained.

Furthermore, when A1 is Bi (bismuth), B1 is Co (cobalt), Ni (nickel), or Zn (zinc), B2 is Nb (niobium), Sb (antimony), or Ta (tantalum), and the value of β is almost twice the value of γ, the above effect is also obtained.

Application Example

FIG. 5 is a sectional view illustrating an application example of a piezoelectric ceramic composition. This sectional view illustrates a part of an ink jet head 11. The lower part (−D3 side) of the sheet of FIG. 5 is a side on which a recording medium (for example, paper) is disposed.

The head 11 is, for example, a substantially plate-like member and includes a plurality of structures illustrated in FIG. 5 along a plane orthogonal to the D3 axis. The head 11 has a thickness (in the D3 direction) of, for example, 0.5 mm or more and 2 mm or less. A plurality of ejection holes 3 (only one ejection hole is illustrated in FIG. 5) through which droplets are ejected opens in an ejection surface 2a of the head 11 facing the recording medium. The plurality of ejection holes 3 is two-dimensionally arranged along the ejection surface 2a.

The head 11 is a piezoelectric head configured to apply a pressure to a liquid by mechanical strain of a piezoelectric element to eject a droplet. The head 11 includes a plurality of ejection elements 37 each having ejection holes 3. In FIG. 5, one ejection element 37 is illustrated. The plurality of ejection elements 37 is two-dimensionally arranged along the ejection surface 2a.

In another viewpoint, the head 11 includes a plate-like flow channel member 13 having flow channels through which a liquid (ink) flows, and an actuator substrate 15 (an example of a piezoelectric actuator) configured to apply a pressure to the liquid in the flow channel member 13. Each of the plurality of ejection elements 37 is formed by the flow channel member 13 and the actuator substrate 15. The ejection surface 2a is formed by the flow channel member 13.

The flow channel member 13 has a common flow channel 19 and a plurality of individual flow channels 17 (one individual flow channel is illustrated in FIG. 5) each connected to the common flow channel 19. Each of the individual flow channels 17 has the ejection hole 3 described above and has a connection flow channel 25, a pressurization chamber 23, and a partial flow channel 21 in this order from the common flow channel 19 to the ejection hole 3. The pressurization chamber 23 opens in a surface of the flow channel member 13, the surface being opposite to the ejection surface 2a. The partial flow channel 21 extends from the pressurization chamber 23 toward the ejection surface 2a. The ejection hole 3 opens in a bottom surface 21a of the partial flow channel 21.

The plurality of individual flow channels 17 and the common flow channel 19 are filed with a liquid. The volumes of a plurality of pressurization chambers 23 are changed to apply a pressure to the liquid. The liquid is thereby sent from the plurality of pressurization chambers 23 to a plurality of partial flow channels 21, and a plurality of droplets is ejected from the plurality of ejection holes 3. The plurality of pressurization chambers 23 is replenished with the liquid from the common flow channel 19 through a plurality of connection flow channels 25.

The flow channel member 13 is formed by, for example, stacking a plurality of plates 27A to 27J (hereinafter, A to J may be omitted). A plurality of holes (which is mainly through-holes or may be recesses) that forms a plurality of individual flow channels 17 and a common flow channel 19 is formed in the plates 27. The thicknesses and the number of the plurality of plates 27 stacked may be appropriately determined in accordance with, for example, the shapes of the plurality of individual flow channels 17 and the common flow channel 19. The plurality of plates 27 may be formed of an appropriate material. For example, the plurality of plates 27 is formed of a metal or a resin. The plates 27 each have a thickness of, for example, 10 μm or more and 300 μm or less. The coefficient of linear expansion of the flow channel member 13 is, for example, larger than the coefficients of linear expansion of the actuator substrate 15 and the piezoelectric ceramic composition.

The actuator substrate 15 has a substantially plate shape having an area throughout the plurality of pressurization chambers 23. The actuator substrate 15 is formed by a so-called unimorph piezoelectric actuator. The actuator substrate 15 may be formed by another piezoelectric actuator such as a bimorph piezoelectric actuator. The actuator substrate 15 includes, for example, a vibration plate 29, a common electrode 31, a piezoelectric layer 33, and an individual electrode 35 in this order from the flow channel member 13 side.

The vibration plate 29, the common electrode 31, and the piezoelectric layer 33 extend over the plurality of pressurization chambers 23 in plan view. Specifically, these are provided for the plurality of pressurization chambers 23 in common. The individual electrode 35 is provided for each pressurization chamber 23. The individual electrode 35 includes a body 35a that overlaps the pressurization chamber 23 and an extension electrode 35b extending from the body 35a. The extension electrode 35b contributes to connection to a signal line (not illustrated).

The piezoelectric layer 33 is formed of, for example, a piezoelectric ceramic composition according to the present embodiment. A portion of the piezoelectric layer 33 disposed between the individual electrode 35 and the common electrode 31 is polarized in the thickness direction. Accordingly, for example, when an electric field (voltage) is applied in the polarization direction of the piezoelectric layer 33 by the individual electrode 35 and the common electrode 31, the piezoelectric layer 33 contracts in the direction along the piezoelectric layer 33. This contraction is controlled by the vibration plate 29. As a result, the actuator substrate 15 bends and deforms to become convex toward the pressurization chamber 23 side. Furthermore, the volume of the pressurization chamber 23 is reduced, and a pressure is applied to the liquid in the pressurization chamber 23. When an electric field (voltage) is applied in a direction opposite to the above-described direction by the individual electrode 35 and the common electrode 31, the actuator substrate 15 bends and deforms toward the side opposite to the pressurization chamber 23.

The thickness, the material, and the like of each of the layers that form the actuator substrate 15 may be appropriately determined. As one example, the thicknesses of the vibration plate 29 and the piezoelectric layer 33 may each be 10 μm or more and 40 μm or less. The thickness of the common electrode 31 may be 1 μm or more and 3 μm or less. The thickness of the individual electrode 35 may be 0.5 μm or more and 2 μm or less. The material of the vibration plate 29 may be a ceramic material that has piezoelectricity or that does not have piezoelectricity. The material of the common electrode 31 may be a metal material such as a Ag—Pd-based material. The material of the individual electrode 35 may be a metal material such as a Au-based material.

The temperature range (operating temperature range) in which the head 11 (actuator substrate 15) is used may be appropriately set in consideration of various matters. For example, the operating temperature range of the head 11 is 20° C. or higher and 40° C. or lower. A matter considered in setting the operating temperature range is, for example, a correlation between the temperature and the viscosity in ink. The operating temperature range of the head 11 may be specified on the basis of, for example, specifications, an instruction manual and/or a pamphlet, or the like. In such information, the operating temperature range may be described as an expression of, for example, a temperature range in which the head 11 (and/or a printer, hereinafter the same) can be used, a temperature range in which the normal operation of the head 11 is guaranteed, or a recommended temperature range. However, these expressions are usually identical to each other. If two or more temperature ranges are shown, the widest temperature range may be determined as the operating temperature range in the present embodiment.

As described above, the actuator substrate 15 (one example of a piezoelectric actuator) according to the application example includes the potassium sodium niobate-based piezoelectric layer 33 (one example of a piezoelectric ceramic). In the piezoelectric layer 33, a transition temperature at which a phase transition between an orthorhombic crystal structure and a tetragonal crystal structure occurs lies in the operating temperature range (as one example, 20° C. or higher and 40° C. or lower), which is a temperature range in which a voltage is applied to the piezoelectric layer 33. In addition, αt/αo is 0.72 or more where αo represents a coefficient of linear expansion determined when the crystal structure is orthorhombic in the operating temperature range, and αt represents a coefficient of linear expansion determined when the crystal structure is tetragonal in the operating temperature range.

In this case, for example, when the temperature of the actuator substrate 15 increases, a decrease in the coefficient of linear expansion of the actuator substrate 15 is reduced. As a result, an increase in the difference in coefficient of linear expansion between the actuator substrate 15 and the flow channel member 13 having a larger coefficient of linear expansion than the actuator substrate 15 is reduced. Furthermore, an increase in thermal stress generated in the actuator substrate 15 is reduced. This reduces a change in ejection properties and reduces the possibility of degradation of the actuator substrate 15.

The technology according to the present disclosure is not limited to the above embodiments and may be implemented in various forms.

For example, the piezoelectric ceramic composition is not limited to a piezoelectric ceramic composition represented by formula (1) or having a composition close to that represented by formula (1). The piezoelectric ceramic composition may be used in sensors, vibrators, filters, or the like besides actuators. The actuators are not limited to those used in ink jet heads but may be actuators used in various devices.

The invention claimed is:

1. A piezoelectric ceramic composition comprising:
   potassium sodium niobate,
   wherein a transition temperature at which a phase transition between an orthorhombic crystal structure and a tetragonal crystal structure occurs lies in a temperature range of −20° C. or higher and 60° C. or lower, and αt/αo is 0.72 or more,
   where αo represents a coefficient of linear expansion determined when a crystal structure is orthorhombic in the temperature range, and αt represents a coefficient of linear expansion determined when a crystal structure is tetragonal in the temperature range.

2. The piezoelectric ceramic composition according to claim 1,
   wherein αt/αo is more than 0.85.

3. The piezoelectric ceramic composition according to claim 1, being represented by a composition formula $A_xBO_3$,
   wherein the piezoelectric ceramic composition comprises
   K, Na, and Li that account for 90% or more of an amount of A-site elements,
   Nb, Ta, and Sb that account for 90% or more of an amount of B-site elements,
   Ag at an A-site, and
   Fe at a B-site.

4. The piezoelectric ceramic composition according to claim 3, being represented by a composition formula $$\{(K_{1-u-v}Na_uLi_v)_{1-w-\alpha}Ag_wAl_\alpha\}_x\{(Nb_{1-y-z}Ta_ySb_z)_{1-\beta-\gamma-\delta}B1_\beta B2_\gamma Fe_\delta\}O_3$$

wherein A1 is Bi, La, Ce, Nd, or Sm or a combination thereof,
   B1 is Zn, Mg, Yb, Fe, Cu, Co, or Ni or a combination thereof, and
   B2 is Sn, Ti, Zr, Hf, Ce, Ge, V, W, Nb, Sb, or Ta or a combination thereof.

5. The piezoelectric ceramic composition according to claim 4,
   wherein the following inequalities are satisfied:

$$0.500 \leq u \leq 0.540,$$

$$0.00 < v \leq 0.06,$$

$$0.00 < w \leq 0.06,$$

$$0.99 \leq x \leq 1.02,$$

$$0.00 < y \leq 0.12,$$

$0.00 < z \le 0.10$, $0.0000 < \alpha \le 0.0275$, $0.000 < \beta \le 0.005$, $0.000 < \gamma \le 0.005$, and $0.0000 < \delta \le 0.0125$.

6. The piezoelectric ceramic composition according to claim 4,
wherein A1 is Bi, and
$\alpha/\delta$ is 2.2 or more and 5.0 or less.

7. The piezoelectric ceramic composition according to claim 4,
wherein u/v is 10.1 or more and 11.0 or less.

8. The piezoelectric ceramic composition according to claim 4,
wherein z is 0.01 or more and 0.09 or less, and
y/z is 0.7 or more and 10.0 or less.

9. The piezoelectric ceramic composition according to claim 5,
wherein A1 is Bi, B1 is Zn, and B2 is Sn, and the following formulae are satisfied:

$0.524 \le u \le 0.540$, $0.05 \le v \le 0.06$, $0.02 \le w \le 0.06$, $0.99 \le x \le 1.02$, $0.04 \le y \le 0.10$, $0.06 \le z \le 0.08$, $0.0045 \le \alpha \le 0.0125$ $0.000 < \beta \le 0.005$, $\beta = \gamma$, and $0.0010 \le \delta \le 0.0100$.

10. The piezoelectric ceramic composition according to claim 4,
wherein B1 is any one of Zn, Mg, Fe, Cu, Co, and Ni, and B2 is any one of Sn, Ti, Zr, Hf, Ge, Nb, Sb, and Ta.

11. The piezoelectric ceramic composition according to claim 1, comprising:
Fe and Bi,
wherein a ratio calculated by dividing an amount of Bi element by an amount of Fe element is 2.2 or more and 5.0 or less.

12. A piezoelectric actuator comprising:
a piezoelectric ceramic based on potassium sodium niobate,
wherein the piezoelectric ceramic has, in a temperature range in which a voltage is applied to the piezoelectric ceramic, a transition temperature at which a phase transition between an orthorhombic crystal structure and a tetragonal crystal structure occurs lies in a temperature range of −20° C. or higher and 60° C. or lower, and
$\alpha t/\alpha o$ is 0.72 or more,
where $\alpha o$ represents a coefficient of linear expansion determined when a crystal structure is orthorhombic in the temperature range, and $\alpha t$ represents a coefficient of linear expansion determined when a crystal structure is tetragonal in the temperature range, and
the piezoelectric ceramic comprising potassium sodium niobate.

* * * * *